(12) United States Patent
Manzur

(10) Patent No.: US 8,849,080 B1
(45) Date of Patent: Sep. 30, 2014

(54) MONOLITHICALLY INTEGRATED FIBER OPTIC COUPLER

(71) Applicant: Tariq Manzur, Lincoln, RI (US)

(72) Inventor: Tariq Manzur, Lincoln, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 55 days.

(21) Appl. No.: 13/740,346

(22) Filed: Jan. 14, 2013

(51) Int. Cl.
*G02B 6/34* (2006.01)
*H01S 3/00* (2006.01)
*H01S 3/094* (2006.01)
*H01S 3/067* (2006.01)
*G02B 6/02* (2006.01)

(52) U.S. Cl.
CPC ............ *G02B 6/34* (2013.01); *H01S 3/094003* (2013.01); *H01S 3/067* (2013.01); *G02B 6/02095* (2013.01); *H01S 3/094019* (2013.01); *H01S 3/0675* (2013.01); *H01S 3/06708* (2013.01)
USPC ................... 385/37; 385/15; 385/27; 385/31; 385/32; 385/38; 385/47; 385/49; 385/88; 385/89; 359/341.1; 359/341.3

(58) Field of Classification Search
CPC .. G02B 6/2934; G02B 6/3534; G02B 6/3644; G02B 6/02004; G02B 6/02342; G02B 6/262; H01S 3/00; H01S 3/094003; H01S 3/094007; H01S 3/094019; H01S 3/094023; H01S 3/06708; H01S 3/067; H01S 3/0675

USPC ................. 385/15, 27, 31–32, 37–38, 47, 49, 385/88–89; 359/341.1, 341.3
See application file for complete search history.

(56) References Cited

U.S. PATENT DOCUMENTS

| | | | | |
|---|---|---|---|---|
| 5,917,188 | A  * | 6/1999 | Atkinson et al. | 250/339.13 |
| 6,490,388 | B1 * | 12/2002 | Manzur | 385/27 |
| 6,603,909 | B2 * | 8/2003 | Varner | 385/123 |
| 6,842,570 | B2 * | 1/2005 | Komine | 385/43 |
| 7,046,432 | B2 * | 5/2006 | Staroudomov | 359/341.32 |
| 7,064,889 | B2 * | 6/2006 | Digonnet et al. | 359/341.1 |
| 7,386,021 | B2 * | 6/2008 | Kashyap | 372/34 |
| 7,633,621 | B2 * | 12/2009 | Thornton | 356/432 |
| 2004/0036955 | A1* | 2/2004 | Digonnet et al. | 359/341.1 |
| 2006/0187541 | A1* | 8/2006 | Staroudomov | 359/341.32 |
| 2008/0080804 | A1* | 4/2008 | Kim et al. | 385/4 |
| 2008/0221456 | A1* | 9/2008 | Babchenko | 600/476 |
| 2009/0130622 | A1* | 5/2009 | Bollinger et al. | 433/29 |
| 2011/0118715 | A1* | 5/2011 | Zerfas | 606/15 |

* cited by examiner

*Primary Examiner* — Ryan Lepisto
*Assistant Examiner* — Guy Anderson
(74) *Attorney, Agent, or Firm* — James M. Kasischke; Michael P. Stanley

(57) ABSTRACT

An optical fiber coupler includes a clad optical fiber core having a coupling window formed therein. A laser source is joined to emit light into the core through the coupling window. The core has an output coupler for partially reflecting a portion of light and transmitting a portion as output. A Bragg grating is formed in the core having a pitch and being positioned to reflect light from said laser source toward the output coupler. The pitch is variable in response to a temperature change. A thermal control device is joined to the core for adjusting its temperature and the Bragg grating pitch. In other embodiments a mode convertor is provided to reduce the output modes to selected modes.

16 Claims, 3 Drawing Sheets

MONOLITHICALLY INTEGRATED FIBER OPTIC COUPLER

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION (1) Field of the Invention

The present invention relates to waveguide/large core fiber couplers, and more specifically to monolithically integrated waveguide or large core fiber couplers for multi-wavelength, high power, beam combining with increased brightness and/or beam quality.

(2) Description of the Prior Art

U.S. Pat. No. 6,490,388 discloses a side-pumped laser including an optical fiber with a core and a cladding. The core has an index of refraction $n_1$ and the cladding has an index of refraction $n_2$, where $n_1 > n_2$. The fiber further includes a coupling window integrally formed within a channel formed in an upper side of the fiber cladding. The coupling window consists of an optical material having an index of refraction of n where $n_3 > n_1$. The fiber laser further includes a laser light source that is directed through the coupling window where laser light is directly coupled into the core of the fiber. The fiber of the laser also preferably includes Bragg gratings written into the core beneath the coupling window and a reflective material disposed in a second window formed beneath the Bragg gratings. The side-pumped fiber laser is located at a distance from the fiber in order to direct light into the coupling window of the fiber. A need still exists to improve coupling efficiency of side pumped laser arrangements.

SUMMARY OF THE INVENTION

It is a first object of the present invention to provide a monolithically integrated waveguide/fiber coupler having high coupling efficiency for side-coupling laser light directly into the core of a monolithically integrated single or multi-mode clad waveguide/fiber.

It is another object to provide a monolithically integrated waveguide/fiber coupler that allows mode-locking.

It is another object to provide a monolithically integrated waveguide/fiber coupler that is wavelength tunable through temperature control.

It is another object to provide a monolithically integrated waveguide/fiber coupler including tilted Bragg gratings to enhance and direct coupling of the light into the core of the waveguide/fiber.

Other objects and advantages of the present invention will become apparent from the following description and claims, in conjunction with the drawings.

Accordingly, there is provided a simple and efficient means for side-coupling laser light into the core of a monolithically integrated single or multimode clad waveguide/fiber is realized using a waveguide/fiber coupler which includes an optical waveguide/fiber having a core and a cladding. The core has an index of refraction $n_1$ and the cladding has an index of refraction $n_2$, wherein $n_1$ is greater than $n_2$. The waveguide/fiber coupler further includes: multi-wavelength semi-conductor lasers (bars or chips) integrally distributed along one side of the waveguide/fiber cladding; a coupling window integrally formed within a channel in the side of the waveguide/fiber cladding; tilted Bragg gratings written into the core beneath the bar/chip lasers; a reflective material (mirror) disposed in the terminal end of the waveguide/fiber; and an optical coupler such as a partially reflective mirror located at the output end of the waveguide/fiber.

The tilted Bragg gratings reflect light propagating from the semiconductor lasers along an axis of the waveguide/fiber toward the optical coupler. Below the tilted Bragg gratings are temperature control devices that are capable of modifying the pitch of the tilted Bragg gratings, thereby changing their reflective properties at specific wavelengths to provide tunability. Light that is backscattered is reflected forward by the terminal end mirror. The optical coupler reflects light to the tilted Bragg gratings and then to the semiconductor lasers to lock the wavelength modes, resulting in a constant $M^2$ value for the optical output.

BRIEF DESCRIPTION OF THE DRAWINGS

Reference is made to the accompanying drawings in which is illustrated an embodiment of the invention, from which its novel features and advantages will be apparent, and wherein.

DETAILED DESCRIPTION OF THE INVENTION

Figure 1:
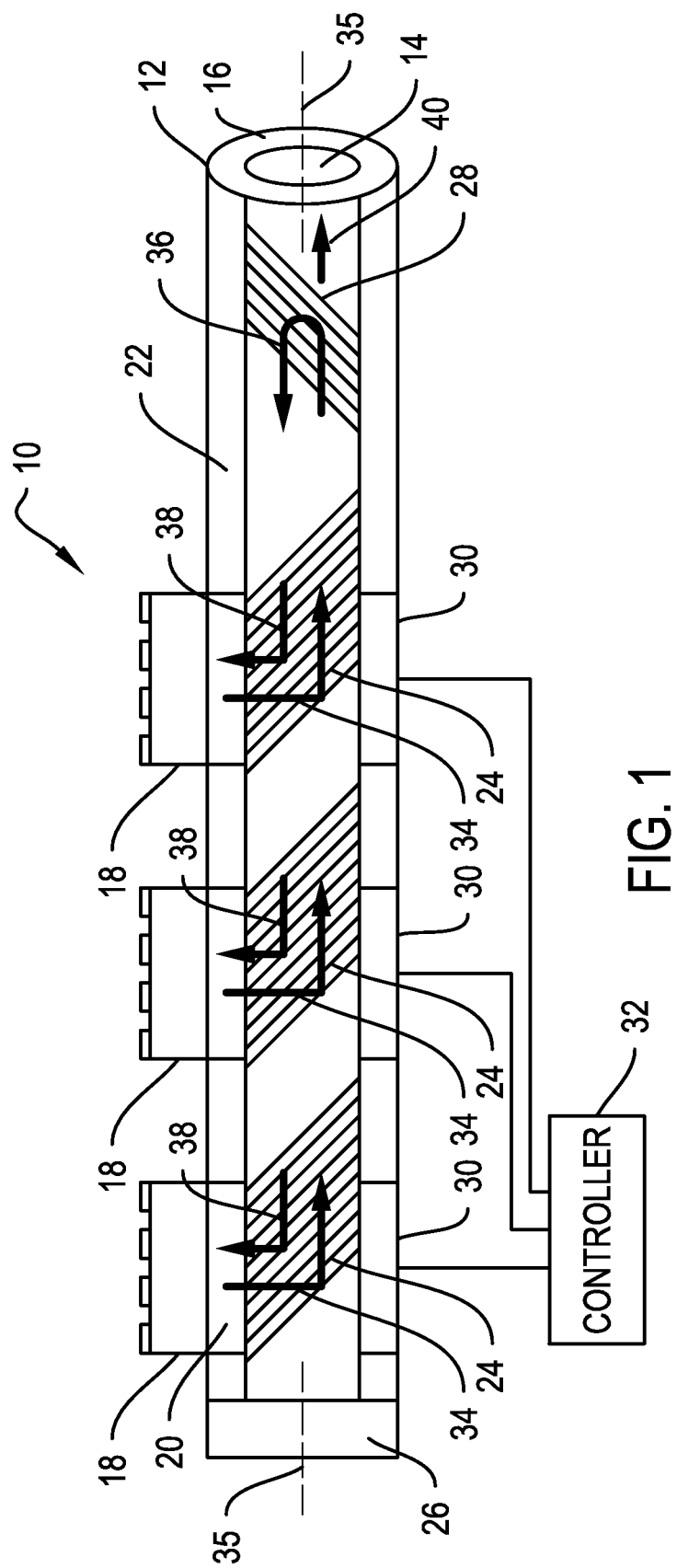
FIG. 1 is a schematic cross-sectional view of a single channel of a monolithically integrated waveguide/fiber coupler.

As shown in the drawings, a monolithically integrated waveguide or large core fiber coupler 10 includes an optical waveguide/fiber 12 having a core 14 and a cladding 16. The core 14 has an index of refraction $n_1$, and the cladding 16 has an index of refraction $n_2$, wherein $n_1$ is greater than $n_2$. Coupler 10 includes multi-wavelength bar or chip lasers 18 integrally distributed along an upper side of waveguide/fiber cladding 12.

Also built within the coupler 10 are one or more coupling windows 20. Windows 20 can be integrally formed within a channel 22 in one side of the waveguide/fiber cladding 16. Coupling window 20 is made from an optical material having an index of refraction $n_3$ where $n_3$ is greater than the index of refraction of the core, $n_1$. The coupler 10 also includes tilted Bragg gratings 24 written into the core 14 proximate the bar/chip lasers 18.

Coupler 10 includes a reflective material 26 (e.g., a mirror 26) disposed in a terminal end of the coupler 10, and an output coupler 28 disposed at the output end of the coupler 10. Output coupler 28 may likewise be composed of a highly reflective two-dimensional photonic crystal structure, a Bragg grating, a partially reflective mirror or another partially reflective structure known in the art. Tilted Bragg gratings 24 reflect the downward propagating light from the lasers 18 along waveguide/fiber 12 toward the output coupler 28.

Below the tilted Bragg gratings 24 are thermoelectric coolers (TECs) 30 that can modify the pitch of the tilted Bragg gratings 24, thereby changing their reflective properties to specific wavelengths to provide tunability. Heating or cooling by thermoelectric coolers 30 causes expansion or contraction of fiber optic core 14 resulting in an expansion or contraction of the pitch of the associated Bragg grating 24. This pitch change allows reflection of a different wavelength of light. While thermoelectric coolers are preferred, devices 30 can be any reversible cooling/heating device that is sufficiently compact for the application. This can include fluid transfer heating/cooling devices and other electrical devices. TECs are preferred because they allow rapid electrical control of temperature at the surface of fiber 12. Devices 30 are joined to an appropriate controller 32 for providing a fluid or voltage as required by the device.

In operation, lasers 18 provide laser light 34 through windows 20. Bragg gratings 24 reflect light 34 along an axis 35 of fiber 12 core 14. Light that is backscattered in the waveguide/fiber 12 is reflected forward by the terminal mirror 26. Output coupler 28 inside core 14 provides feedback by reflecting light 36 back toward the terminal end and Bragg gratings 24. Bragg gratings 24 reflect the feedback light 38 back to lasers 18. Impingement of feedback light 38 locks the wavelength modes, resulting in a constant $M^2$ value for the optical output. It is well known that wavelength modes of various orders define the shape of a beam, and locking the mode refers to locking or tuning to a specific wavelength.

The monolithically integrated waveguide/fiber coupler 10 of FIG. 1 provides a simple and efficient means for side-coupling of laser light 34 into the core 14 of the single or multimode clad waveguide/fiber 12. The coupler 10 couples light 34, received from the compact multi-wavelength lasers 18, directly into the single-mode or multimode fiber 12. The tilted Bragg gratings 24 in the fiber 12 reflect the downward propagating light 34 from the lasers 18 along the axis 35 of the waveguide/fiber 12 toward the output coupler 28. The output coupler 28 then reflects light to lock or tune the wavelength modes to an optimum operational wavelength, resulting in a constant $M^2$ value represented by a bell curve for the optical output waveguide/fiber coupler 10.

Figure 2:
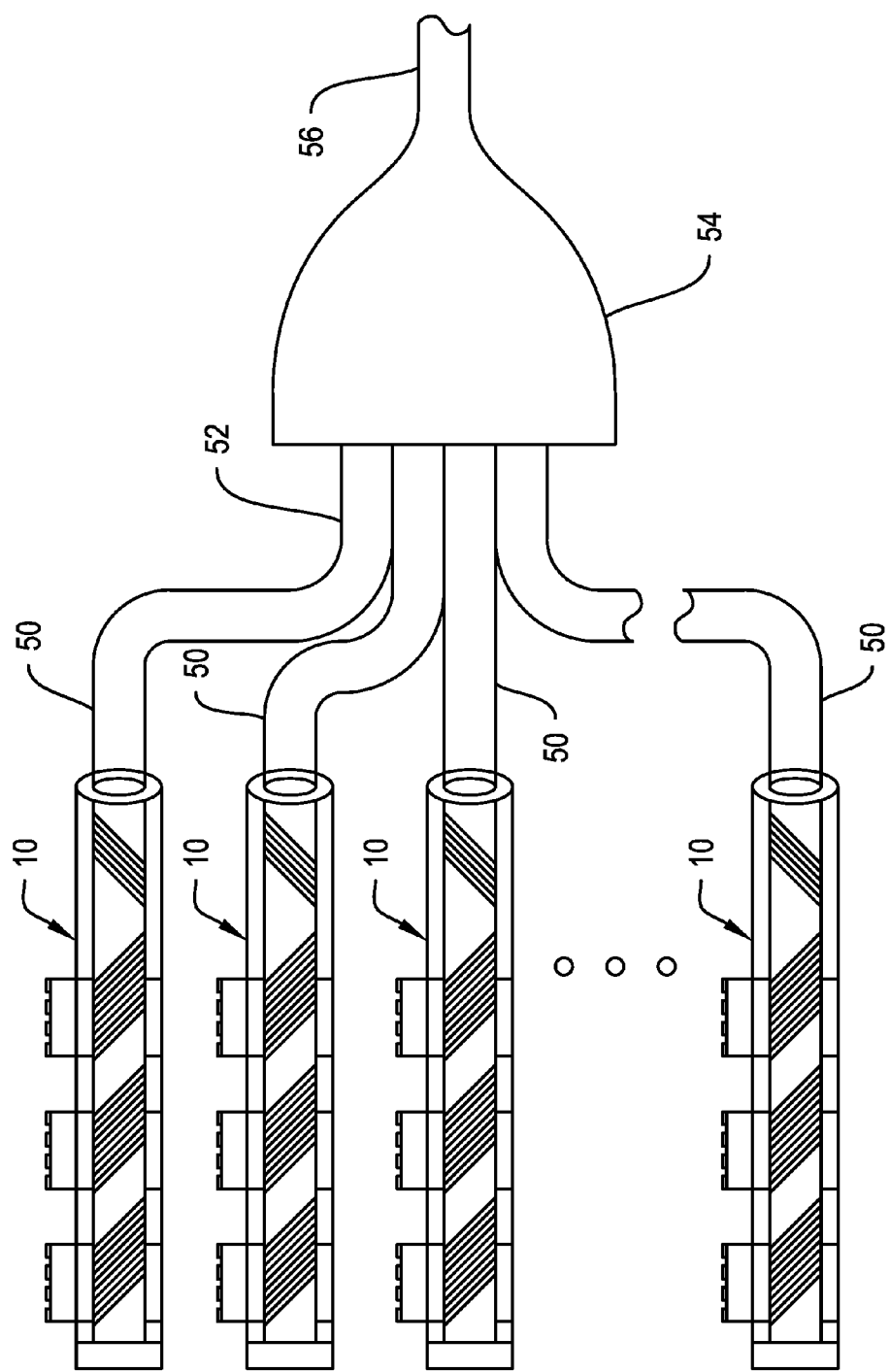
FIG. 2 is schematic cross-sectional view of multiple channels of a monolithically integrated waveguide/fiber coupler.

A number N of monolithically integrated waveguide/fiber couplers 10 are shown in FIG. 2, where each coupler 10 outputs a wavelength $\lambda_1$ to $\lambda_N$, respectively, and these wavelengths are tuned or locked by the respective output couplers inside the coupler 10 to reflect light and lock the optimum operational wavelength modes, resulting in a constant $M^2$ value for each optical output 50. Each output 50 of the N couplers 10, representing channels 1 to N, is provided to a fused fiber 52 and thereafter output to the ferrule 54. Multiple output fibers 50 are fused together into a single fused fiber 52 and drawn into ferrule 54 in order to provide an output as a photonic crystal fiber (PCF) or photonic bandgap (PBG) fiber 56. One possible way of performing this is given utilizing the technique described by S. Leon-Saval et al., "Splice-free interfacing of photonic crystal fibers," Optics Letters, Vol. 30, Pages 1629-1631 (2005), herein incorporated by reference for background information only. In this technique, the fused output fibers 52 are fed in a central void of the ferrule 54 (i.e., intermediate perform) without the need for splicing, and then drawn into the reduced diameter air-silica photonic crystal fiber 56 (PCF) or photonic band gap (PBG) fiber, which is connected by a continuous transition of the fiber/waveguide from the fused fibers 52 to the PCF/PCB fiber 56. This process involves adiabatic propagation rather than resonant coupling, the former of which is associated with high extinction across a wide range of wavelengths with low losses.

The PCF/PBG fiber 56 includes metamaterials of superlattices formed by metal nanoparticles. The binary superlattices are formed by self-assembly of metal (e.g., Au, PbSe) nanoparticles of different origin and having a negative index of refraction. Metamaterials are deposited in the PCF or PBG fiber core to facilitate mode conversion. The modes exiting the tapered input fiber/waveguide core become guided by the surrounding PCF/PBG fiber core, the scaling of which is designed for the single-mode regime characterized by the V parameter $V_{PCF} < \pi$. Higher order modes present are effectively transformed to the fundamental mode (e.g., $TE_{01}$ mode) having the lowest propagation loss. The mode conversion from higher order modes to a lower order mode or modes involves adiabatic propagation associated with high extinction across a wide range of wavelengths with low losses. Model conversion to the fundamental mode at the output of the PCF/PBG 56 is induced through scaling of the PCF/PBG geometry and the negative index of the metamaterial in the PCF/PBG fiber core.

In a PCF/PBG fiber, air holes permeating through the length of the waveguide/fiber and/or negative index metamaterials provide confinement and guidance of the light, where the guidance mechanism depends on the nature of the air-hole arrangement and the geometrical scaling and periodicity of the metamaterials; for an air core PBG fiber, a photonic bandgap and/or metamaterial confines light rather than total internal reflection characteristic of conventional waveguide/fibers. The metamaterial is comprised of binary superlattices formed by self-assembly of metal nanoparticles of different origin and positioned at sub-wavelength intervals to induce the negative index.

The multimode cutoff properties and modal behavior of PCFs can be understood by the concept of the V parameter. For PCFs, $V_{PCF} \approx \pi$, below which value the waveguide/fiber is effectively single-mode. The modes exiting the tapered input fiber/waveguide core become guided by the surrounding PCF core, the scaling of which is designed for the single-mode regime ($V_{PCF} < \pi$). Higher order modes present are effectively transformed to the fundamental mode (e.g., $TE_{01}$ mode) having the lowest propagation loss, and thus the functionality of this part of the device is characteristic of a mode converter.

Methods for mode conversion using PCFs are presented by K. Lai et al., "Wavelength-independent all-fiber mode converters," Optics Letters, Vol. 32, Pages 328-330 (2007), and the V-parameter for PCFs is discussed in the article by M. Nielson et al., "Modal cutoff and the V parameter in photonic crystal fibers," Optics Letters, Vol. 28, Pages 1879-1881 (2003), both herein incorporated by reference for background information only.

A broadband photon trapping structure may be used to confine photons of selective wavelengths at the window, where Bragg gratings located below the photon trapping structures reflect and channel light along the core. The photon trapping structures can be provided as a periodic array of pyramidal absorber or two-dimensional photonic crystal structures within the core. The photon trapping structures confine a high percentage of the incident light without the need for antireflection (AR) coatings, and provide sufficiently large bandwidths to support optical input covering a significant frequency range. The trapped light may then be reflected and channeled using multiple Bragg gratings located below the photon trapping structure.

Figure 3:
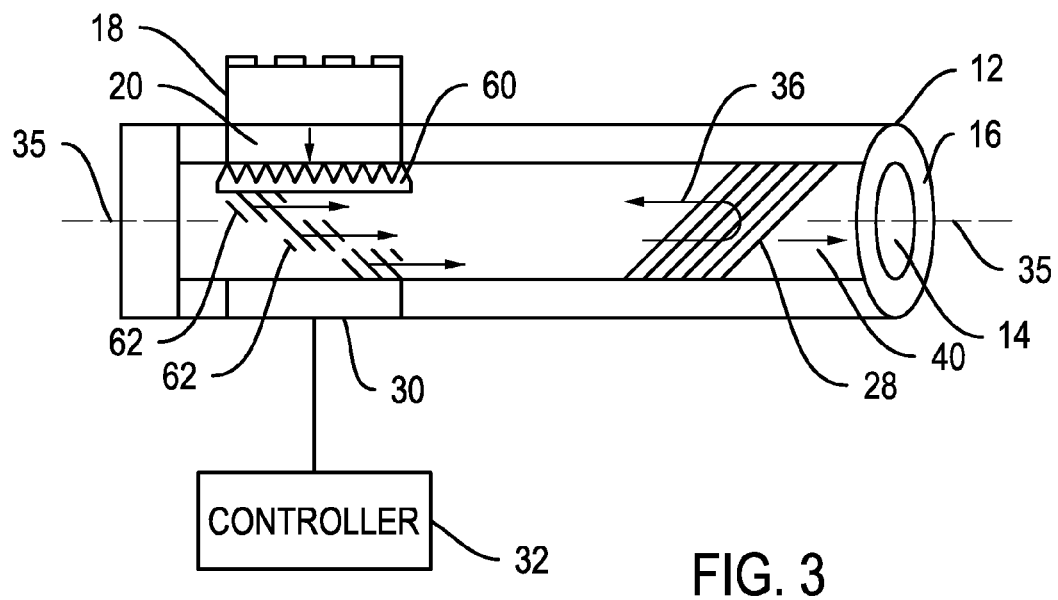
FIG. 3 is a schematic cross-section showing coupling of light into a fiber/waveguide core using a photon trapping structure.

FIG. 3 provides a schematic cross section showing an alternative embodiment of the current invention. In this embodiment, a fiber optic core 14 having cladding 16 with a window 20 formed therein. A bar or chip semiconductor laser 18 is positioned to provide light to core 14 through window 20. Core 14 has a photon trapping structure 60 formed therein. Photon trapping structure 60 is made from a compound semiconductor material and acts to confine a high percentage of directly incident light with near elimination of front side reflection. Photon trapping structure 60 thus takes the place of an antireflection coating. This prevents interference with mode-locking feedback by front side reflections.

Multiple Bragg gratings 62 are formed in the core 14 to reflect light passing through the photon trapping structure 60 along the axis of the core 35. As in FIG. 1, the pitch of Bragg gratings 62 can be adjusted by raising or lowering the temperature of the Bragg grating and causing expansion or contraction of the optical fiber core 14. This is accomplished by use of thermoelectric coolers 30 joined to a control circuit 32. Output coupler 28 allows transmission of a portion 40 of the light reflected along the axis 35 of the core 14 and reflects the remainder 36 of the light back to Bragg gratings 62 to serve as mode-locking feedback.

Electromagnetic metamaterials integrated into or fabricated (such as by laser writing) in the waveguide/fiber core may be utilized to effectively function as a mode converter to transform higher order modes into the fundamental mode. This may be accomplished by induced bending of light around the material, characteristic of this class of metamaterials, effectively filtering out higher order modes in the process. The range of wavelengths affected, and thus the optical behavior the metamaterial, may be tuned by modifying the scale and periodicity of the structural properties of the metamaterial.

Figure 4:
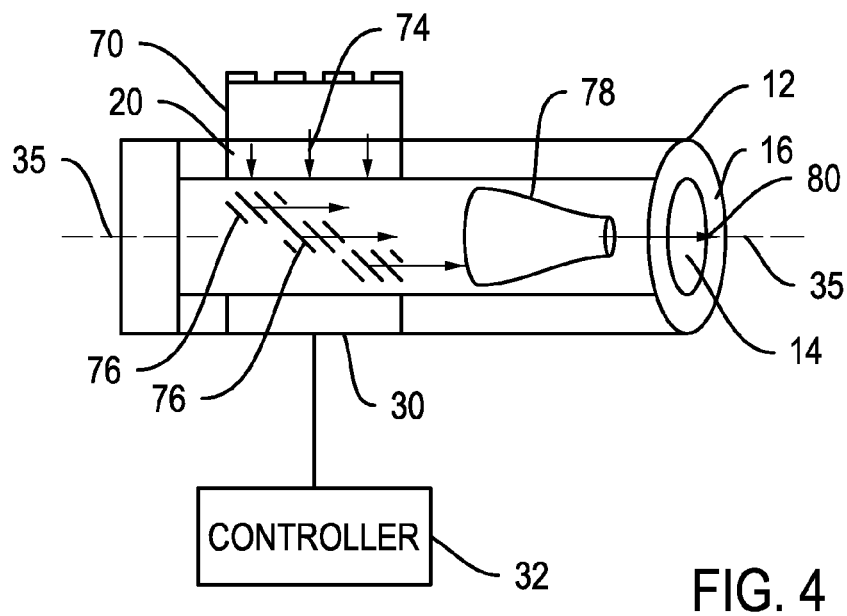
FIG. 4 is schematic cross-sectional view showing coupling of incident modes from bar or chip lasers into a fiber/waveguide core using Bragg gratings, and nanoparticle based metamaterials.

FIG. 4 provides a schematic cross section showing another embodiment of the current invention. This embodiment uses metamaterials or photonic crystals to provide a single mode fiber optic output. As in the previous embodiments, a fiber optic core 14 has a cladding 16 with a window 20 formed in it. A multimode semiconductor laser 70 is joined to provide multimode light 74 to core 14. Bragg gratings or a light bending optical nanostructure 76 is formed in core 14 to reflect light 74 along an axis 35. The pitch of nanostructure 76 can be adjusted by heating or cooling the core 14 utilizing a thermoelectric cooling circuit 30 and a controller 32.

A photonic crystal or metamaterial structure 78 is provided in core 14. Photonic crystal structure 78 is designed to provide a photonic band gap that will allow passage of a selected mode. Other modes will leak out of structure 78 and not be transmitted. Typically, the selected mode is the fundamental mode; however, structures allowing passage of other modes can be selected. Structure 78 can be an array of columns oriented along axis 35 and surrounded by a material having a lower or higher dielectric constant. Removal of a row of columns can be used to eliminate undesirable modes. Photonic crystal structure 78 provides a single mode output 80.

The primary advantages and/or innovative features of this invention over previous methods are the combinations of use of multiple coupling waveguides to transmit multiple wavelengths; the use of bar or chip lasers residing directly on the fiber cladding; use of TECs to effectively tune the Bragg gratings; use of an output coupler to reflect light to feedback reflective waveguide to lock the modes, resulting in a constant $M^2$ value for the optical output; fusing of the coupling fibers together with index matching; the ferrule technique for adiabatically coupling the fused fiber to a PCF/PBG; and combination of PCF/PBG and nanoparticle based metamaterial core to convert higher order modes to the fundamental model at the output.

The lasers may be either bar or chip devices as long as they are compact enough to reside above the fiber cladding and perform the required functionality. The output waveguide may be either a photonic crystal fiber (PCF) or photonic bandgap (PBG) fiber. The nanoparticles forming the metamaterials may range from a number of materials including Au and PbSe.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. An optical fiber coupler comprising:
an optical fiber core having an index of refraction $n_1$;
a cladding adjacent to and surrounding said core, said cladding having an index of refraction $n_2$, wherein $n_1$ is greater than $n_2$, said core and cladding extending from a terminal end to an output end wherein said cladding has a window channel formed in said cladding having a depth substantially equal to a thickness of said cladding;
a reflective portion provided at the terminal end for reflecting light towards the output end;
a coupling window, integrally formed within a first side of the cladding, configured to provide a direct coupling path for light injected into said coupling window to enter said core, said coupling window extending substantially entirely through said cladding in abutting relation to said core, said coupling window comprising an optical material having an index of refraction $n_3$ wherein $n_3$ is greater than $n_1$ wherein said coupling window optical material comprises a photon trap structure positioned at said coupling window for preventing reflection of light directly from said laser source back to said laser source;
a laser source joined to emit a laser light beam into said coupling window, passing directly through said coupling window and directly coupled into said core;
an output coupler provided in the output end of said core for reflecting a portion of light toward said terminal end and transmitting another portion of light as output;
a Bragg grating formed in the core having a pitch and being positioned to reflect light from said laser source toward said output coupler, and further positioned to reflect light from said output coupler toward said laser source, said Bragg grating pitch being variable in response to a change in temperature; and
a thermal control device provided proximate said core having said Bragg grating, said thermal control device being capable of adjusting the temperature of said core to a preselected temperature thereby adjusting the Bragg grating pitch.

2. The device of claim 1 further comprising a reflective window integrally formed within a second side of said cladding opposite the first side, said reflective window comprising a reflective optical material extending substantially entirely through said cladding in abutting relation to said core.

3. The device of claim 1 wherein said thermal control device comprises:
   a thermo-electric device capable of changing temperature in response to an electrical current; and
   a controller joined to said thermoelectric device for providing the electrical current.

4. The device of claim 1 wherein said thermal control device comprises:
   a fluid heat exchanger capable of changing temperature in response to a fluid travelling therethrough; and
   a controller joined to said fluid heat exchanger for providing fluid at the desired temperature.

5. The device of claim 1 wherein:
   said coupling window comprises a plurality of coupling windows distributed along said cladding in a spaced apart relationship between the terminal end and the output end; and
   said laser source comprises a plurality of laser sources each laser source being associated with one of said plurality of coupling windows.

6. The device of claim 5 wherein:
   said Bragg grating comprises a plurality of Bragg gratings, each said Bragg grating being associated with one said laser source; and
   said thermal control device comprises a plurality of thermal control devices each associated with a proximate one of said plurality of Bragg gratings.

7. The device of claim 6 wherein:
   each of said plurality of laser sources provides light at a predetermined wavelength; and
   each of said plurality of Bragg gratings reflects light at a predetermined wavelength based on the wavelength of the associated laser source.

8. An optical fiber coupler comprising:
   an optical fiber core having an index of refraction $n_1$;
   a cladding adjacent to and surrounding said core, said cladding having an index of refraction $n_2$, wherein $n_1$ is greater than $n_2$, said core and cladding extending from a terminal end to an output end;
   a reflective portion provided at the terminal end for reflecting light towards the output end;
   at least one coupling window, integrally formed within a first side of the cladding, configured to provide a direct coupling path for light injected into said coupling window to enter said core, said coupling window extending substantially entirely through said cladding in abutting relation to said core, said coupling window comprising an optical material having an index of refraction $n_3$ wherein $n_3$ is greater than $n_1$;
   at least one laser source joined to emit a laser light beam into said at least one coupling window, passing directly through said at least one coupling window and directly coupled into said core;
   a coupling structure positioned proximate said core terminal end for receiving light in said core and transmitting light at a selected wavelength toward said output end as output wherein said coupling structure comprises a photonic crystal structure formed in said fiber optic core proximate said terminal end and capable of transmitting a selected mode of said at least one laser source and dissipating non-selected modes of said at least one laser source;
   a light bending structure positioned in the core and being capable of reflecting light at a selectable range of wavelengths from said laser source toward said coupling structure, a particular wavelength of said range of wavelengths being selectable in response to a change in temperature; and
   a thermal control device provided proximate said core having said light bending structure, said thermal control device being capable of adjusting the temperature of said core to a preselected temperature thereby selecting the particular wavelength.

9. The device of claim 8 wherein:
   said coupling structure comprises a Bragg grating formed in said core proximate said terminal end and capable of transmitting; and
   said light bending structure is capable of reflecting light from said coupling structure toward said at least one laser source.

10. An optical fiber coupler comprising:
    an optical fiber core having an index of refraction $n_1$;
    a cladding adjacent to and surrounding said core, said cladding having an index of refraction $n_2$, wherein $n_1$ is greater than $n_2$, said core and cladding extending from a terminal end to an output end;
    a reflective portion provided at the terminal end for reflecting light towards the output end;
    at least one coupling window, integrally formed within a first side of the cladding, configured to provide a direct coupling path for light injected into said coupling window to enter said core, said coupling window extending substantially entirely through said cladding in abutting relation to said core, said coupling window comprising an optical material having an index of refraction $n_3$ wherein $n_3$ is greater than $n_1$;
    at least one laser source joined to emit a laser light beam into said at least one coupling window, passing directly through said at least one coupling window and directly coupled into said core;
    a coupling structure positioned proximate said core terminal end for receiving light in said core and transmitting light at a selected wavelength toward said output end as output wherein said coupling structure comprises a metamaterial formed in said fiber optic core proximate said terminal end and capable of transmitting a selected mode of said at least one laser source and dissipating non-selected modes of said at least one laser source;
    a light bending structure positioned in the core and being capable of reflecting light at a selectable range of wavelengths from said laser source toward said coupling structure, a particular wavelength of said range of wavelengths being selectable in response to a change in temperature; and
    a thermal control device provided proximate said core having said light bending structure, said thermal control device being capable of adjusting the temperature of said core to a preselected temperature thereby selecting the particular wavelength.

11. The device of claim 8 wherein said light bending structure is a Bragg grating formed in the core having a pitch and being positioned to reflect light from said at least one laser source toward said coupling structure, said Bragg grating pitch being variable in response to a change in temperature.

12. An optical fiber coupler comprising:
    an optical fiber core having an index of refraction $n_1$;
    a cladding adjacent to and surrounding said core, said cladding having an index of refraction $n_2$, wherein $n_1$ is greater than $n_2$, said core and cladding extending from a terminal end to an output end;
    a reflective portion provided at the terminal end for reflecting light towards the output end;

at least one coupling window, integrally formed within a first side of the cladding, configured to provide a direct coupling path for light injected into said coupling window to enter said core, said coupling window extending substantially entirely through said cladding in abutting relation to said core, said coupling window comprising an optical material having an index of refraction $n_3$ wherein $n_3$ is greater than $n_1$;

at least one laser source joined to emit a laser light beam into said at least one coupling window, passing directly through said at least one coupling window and directly coupled into said core;

a coupling structure positioned proximate said core terminal end for receiving light in said core and transmitting light at a selected wavelength toward said output end as output;

a light bending structure positioned in the core and being capable of reflecting light at a selectable range of wavelengths from said laser source toward said coupling structure, a particular wavelength of said range of wavelengths being selectable in response to a change in temperature wherein said light bending structure is a metamaterial reflector formed in the core being capable of reflecting light from said at least one laser source toward said coupling structure, said frequency of light being reflected by said metamaterial reflector being responsive to a change in temperature; and a thermal control device provided proximate said core having said light bending structure, said thermal control device being capable of adjusting the temperature of said core to a preselected temperature thereby selecting the particular wavelength.

13. An optical fiber coupler comprising:

an optical fiber core having an index of refraction $n_1$;

a cladding adjacent to and surrounding said core, said cladding having an index of refraction $n_2$, wherein $n_1$ is greater than $n_2$, said core and cladding extending from a terminal end to an output end;

a reflective portion provided at the terminal end for reflecting light towards the output end;

at least one coupling window, integrally formed within a first side of the cladding, configured to provide a direct coupling path for light injected into said coupling window to enter said core, said coupling window extending substantially entirely through said cladding in abutting relation to said core, said coupling window comprising an optical material having an index of refraction $n_3$ wherein $n_3$ is greater than $n_1$;

at least one laser source joined to emit a laser light beam into said at least one coupling window, passing directly through said at least one coupling window and directly coupled into said core;

a coupling structure positioned proximate said core terminal end for receiving light in said core and transmitting light at a selected wavelength toward said output end as output;

a light bending structure positioned in the core and being capable of reflecting light at a selectable range of wavelengths from said laser source toward said coupling structure, a particular wavelength of said range of wavelengths being selectable in response to a change in temperature wherein said light bending structure is a two-dimensional photonic crystal reflector formed in the core being capable of reflecting light from said at least one laser source toward said coupling structure, said frequency of light being reflected by said photonic crystal reflector being responsive to a change in temperature; and a thermal control device provided proximate said core having said light bending structure, said thermal control device being capable of adjusting the temperature of said core to a preselected temperature thereby selecting the particular wavelength.

14. An optical fiber coupler comprising:

multiple optical fiber cores, each having an index of refraction $n_1$;

multiple claddings, each cladding being adjacent to and surrounding one said core, each said cladding having an index of refraction $n_2$, wherein $n_1$ is greater than $n_2$, said core and cladding extending from a terminal end to an output end;

a reflective portion provided at the terminal end of each of said multiple optical fiber cores for reflecting light towards the output end;

at least one coupling window, integrally formed within a first side of each of said multiple claddings, configured to provide a direct coupling path for light injected into said coupling window to enter said associated core, said coupling window extending substantially entirely through said cladding in abutting relation to said core, said coupling window comprising an optical material having an index of refraction $n_3$ wherein $n_3$ is greater than $n_1$;

at least one laser source joined to emit a laser light beam into each said coupling window, and passing directly through said associated coupling window and directly coupled into said core;

an output coupler provided in the output end of each said core for reflecting a portion of light toward said terminal end and transmitting the other portion of light toward said output end as output;

a Bragg grating formed in each said core having a pitch and being positioned to reflect light from said laser source toward said output coupler, and further positioned to reflect light from said output coupler toward said laser source, said Bragg grating pitch being variable in response to a change in temperature;

at least one thermal control device provided proximate each said core having said Bragg grating, each said thermal control device being capable of adjusting the temperature of each said core to a preselected temperature thereby adjusting the Bragg grating pitch; and at least one mode converter optically joined to each said core output end, said mode converter being capable of transforming output light received from said joined output couplers into light at a selected mode.

15. The device of claim 14 wherein said mode converter comprises:

a plurality of ferrules, each joined to each of said optical fiber cores output end; and a photonic crystal fiber or photonic band gap fiber joined to said plurality of ferrules and capable of transforming light received into light at a selected mode given by the construction of the photonic crystal fiber.

16. The device of claim 14 wherein said mode converter comprises:

a plurality of ferrules, each joined to each of said optical fiber cores output end; and a photonic band gap material joined to said plurality of ferrules and capable of transforming light received into light at a selected mode given by the construction of the photonic crystal fiber.

* * * * *